United States Patent
Jao

(10) Patent No.: US 6,415,974 B2
(45) Date of Patent: Jul. 9, 2002

(54) STRUCTURE OF SOLDER BUMPS WITH IMPROVED COPLANARITY AND METHOD OF FORMING SOLDER BUMPS WITH IMPROVED COPLANARITY

(75) Inventor: Jui-Meng Jao, Miaoli Hsien (TW)

(73) Assignee: Siliconware Precision Industries Co., Ltd., Taichung Hsien (TW)

( * ) Notice: Subject to any disclaimer, the term of this patent is extended or adjusted under 35 U.S.C. 154(b) by 0 days.

(21) Appl. No.: 09/842,038

(22) Filed: Apr. 25, 2001

(30) Foreign Application Priority Data

Aug. 1, 2000 (TW) ........................ 89115393 A

(51) Int. Cl.$^7$ .................. B23K 31/02; H01L 23/48; H01L 29/40; H01L 21/441
(52) U.S. Cl. .................. 228/215; 228/180.22; 228/254; 257/737; 438/613
(58) Field of Search ............... 257/737, 738; 438/613, 614; 228/180.22, 215, 254, 248.1, 248.5, 256

(56) References Cited

U.S. PATENT DOCUMENTS

| | | | |
|---|---|---|---|
| 3,871,014 A | * 3/1975 | King et al. | 228/180.22 |
| 3,871,015 A | * 3/1975 | Lin et al. | 228/180.22 |
| 5,173,763 A | * 12/1992 | Cipolla et al. | 257/668 |
| 5,266,520 A | * 11/1993 | Cipolla et al. | 228/173.1 |
| 5,586,715 A | * 12/1996 | Schwiebert et al. | 164/129 |
| 5,672,542 A | * 9/1997 | Schwiebert et al. | 438/4 |
| 5,736,456 A | * 4/1998 | Akram | 438/613 |
| 5,767,010 A | * 6/1998 | Mis et al. | 438/612 |
| 5,874,199 A | * 2/1999 | Deligianni et al. | 430/312 |
| 5,903,058 A | * 5/1999 | Akram | 257/737 |
| 6,013,572 A | * 1/2000 | Hur et al. | 257/738 |
| 6,107,180 A | * 8/2000 | Munroe et al. | 29/840 |
| 6,146,984 A | * 11/2000 | Leibovitz et al. | 438/613 |
| 6,162,718 A | * 12/2000 | Boettcher | 438/613 |
| 6,190,940 B1 | * 2/2001 | DeFelice et al. | 257/737 |
| 6,194,667 B1 | * 2/2001 | Jimarez et al. | 174/261 |
| 6,222,279 B1 | * 4/2001 | Mis et al. | 257/779 |
| 6,232,212 B1 | * 5/2001 | Degani et al. | 438/612 |
| 6,271,107 B1 | * 8/2001 | Massingill et al. | 438/455 |
| 6,348,401 B1 | * 2/2002 | Chen et al. | 438/614 |
| 6,358,836 B1 | * 3/2002 | Lu et al. | 438/108 |

OTHER PUBLICATIONS

US 2002/0017553 A1 Jao (Feb. 14, 2002).*
US 2001/008310 A1 Sakuyama et al. (Jul. 19, 2001).*

* cited by examiner

*Primary Examiner*—Tom Dunn
*Assistant Examiner*—Kiley Stoner
(74) *Attorney, Agent, or Firm*—Jiawei Huang

(57) ABSTRACT

A structure of solder bumps with improved coplanarility, comprising a substrate, a passivation layer, a plurality of Under Ball Metallurgy (UBM) layers and a plurality of solder bumps. The substrate has at least an active surface, and a plurality of bonding pads are provided thereon. The UBM layers with various areas are electrically connected to the bonding pads. Finally, the solder bumps are formed with uniform-height on the UBM layers. A method of forming solder bumps with improved coplanarity. A UBM structure with various sizes of openings is provided to control the volume of the solder, wherein the various sizes of openings are corresponding to the current distribution across the wafer. The purpose of the various openings is to control the volume of the solder in order to form uniform-heights of solder bumps, the coplanarity of the solder bumps can thus be improved.

11 Claims, 3 Drawing Sheets

STRUCTURE OF SOLDER BUMPS WITH IMPROVED COPLANARITY AND METHOD OF FORMING SOLDER BUMPS WITH IMPROVED COPLANARITY

CROSS-REFERENCE TO RELATED APPLICATION

This application claims the priority benefit of Taiwan application serial no. 89115393, filed Aug. 01, 2000.

BACKGROUND OF THE INVENTION

1. Field of the Invention

The present invention relates generally to semiconductor device fabrication, and more particularly, to a structure of solder bumps with improved coplanarity and a method of forming solder bumps with improved coplanarity.

2. Description of the Related Art

With recent advances in semiconductor fabrication technology and the increasing demand for improving connection density of semiconductor applications, various techniques have been developed for having a large number of input/out points (I/Os) in a device. The flip-chip technology is being utilized to allow more I/Os on an integrated circuit device.

In the packaging industry, the flip-chip packaging can reduce inductance while providing a higher interconnection density and ultimately, a lower cost. The flip-chip technique utilizes solder bumps instead of wires to connect bonding pads on an integrated circuit (IC) device to bonding pads on an IC package or to mounting pads on a circuit board. Since the flip chip technique is faster, denser, thinner, lighter and has a low cost package, one can expect the flip-chip technique to replace wire-bonding. In order to connect the solder bumps to an IC package or directly to a circuit board, it is important that the solder bumps are formed with a uniform height across a semiconductor wafer so that in the later step of bonding a IC device to the IC package can be performed efficiently. However, it is hard to electroplate solder bumps of uniform height all the way across a wafer. One problem with electroplating that contributes to solder bumps being formed at a non-uniform height is the uneven distribution of plating current density across a wafer. The uneven distribution of plating current density causes a thicker layer of solder to be plated over areas where the current density is higher and a thinner layer of solder to be plated over areas where the current density is lower. When the solder bumps having various heights across a wafer, there will be difficulty in the bonding process and the efficiency, reliability and yield of the production will be affected due to the reworked or scraped chips.

The limitations of and a further explanation of the conventional plating technology is disclosed below in reference to FIG. 1A and FIG. 1B FIG. 1A and FIG. 1B are schematic cross-sectional views of a conventional structure of bumps. FIG. 1A illustrates bonding pads formed on a substrate to be used as connecting points for an external circuit. A passivation layer 108 (or an insulating layer) is formed on the bonding pads 102, wherein only a portion of each bonding pad 102 is exposed.

An under ball metallurgy (UBM) layer 104 is formed on the bonding pad 102, wherein the UBM layer has an area 132 or 134. The UBM layer comprises a barrier layer 103 and a plating layer 105, whereby the barrier layer 104 is used to prevent some ions of the bumps from penetrating the bonding pad 102. If the bonding pad is damaged, the device will be affected. The plating layer 105 is to improve the adhesion between the bumps and the bonding pad 102.

Solders 122a and 122b are formed on the UBM layer 104 by a conventional process, wherein the solders are formed unevenly due to the non-uniform plating distribution on the surface of the UBM layer.

FIG. 1B illustrates different heights of solder bumps 106a, 106b formed during a reflow process, wherein the height of solder bump 106b is higher than the bump 106a because the volume of solder 122b is more than the volume of solder 122a.

Different heights of the solder bumps cause bad bonding between chips to a package carriers, and bad connections will also affect the device functions even damaging the devices.

SUMMARY OF INVENTION

It is an object of the present invention to provide an improved UBM structure of forming uniform solder bumps on integrated circuit devices. Wherein the improved UBM structure comprises: a substrate having at least an active surface, which comprises a plurality of bonding pads and those bonding pads serve as connecting nodes to external circuits. A passivation layer is formed over the active surface of the substrate, wherein portions of the bonding pads are exposed by the passivation layer. A plurality of Under Ball Metallurgy (UBM) layers formed on the exposed portions of the bonding pads, wherein each of the UBM layer having a different area and being electrically connected to the bonding pads. A plurality of solder bumps formed on the UBM layers, wherein the solder bumps having various sizes are formed substantially with the same height.

It is another object of the present invention to provide an improved method of forming uniform solder bumps on integrated circuit devices. The improved method of forming uniform solder bumps comprises a substrate having at least an active surface is provided and a plurality of bonding pads are formed on the active surface of the substrate. A passviation layer is formed over the active surface of the substrate, wherein portions of the bonding pads are exposed by the passviation layer. A plurality of Under Ball Metallurgy (UBM) layers is formed on the exposed portions of the bonding pads. A mask layer having a plurality of openings is formed on the exposed bonding pads, wherein the openings have various sizes. A plurality of solder bumps are formed on the UBM layers, wherein the solder bumps are substantially equivalent in volume and height.

BRIEF DESCRIPTION OF THE DRAWINGS

The accompanying drawings are included to provide a further understanding of the present invention, and are incorporated in and constitute a part of this specification. The drawings illustrate embodiments of the invention and, together with the description, serve to explain the principles of the invention. In the drawings.

DESCRIPTION OF PREFERRED EMBODIMENTS

First Embodiment

Figure 1A:
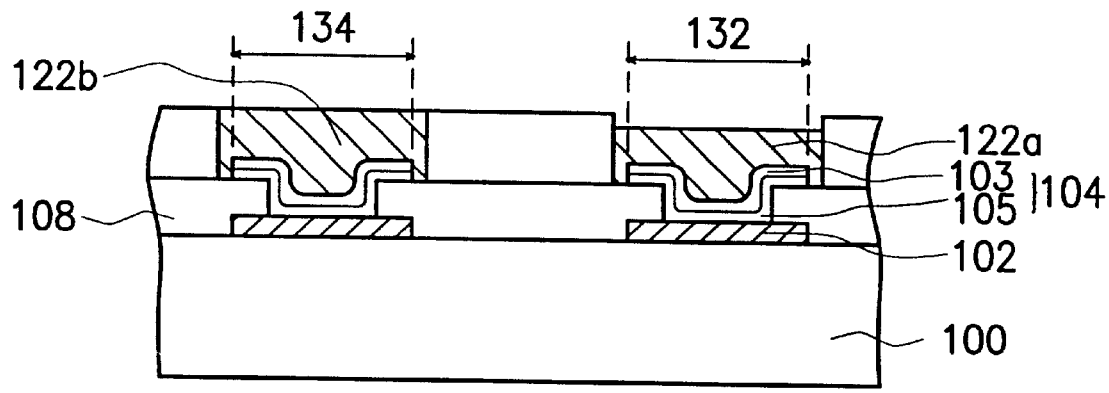
FIGS. 1A and 1B are schematic cross-sectional views of a conventional structure of bumps.
Figure 1B:
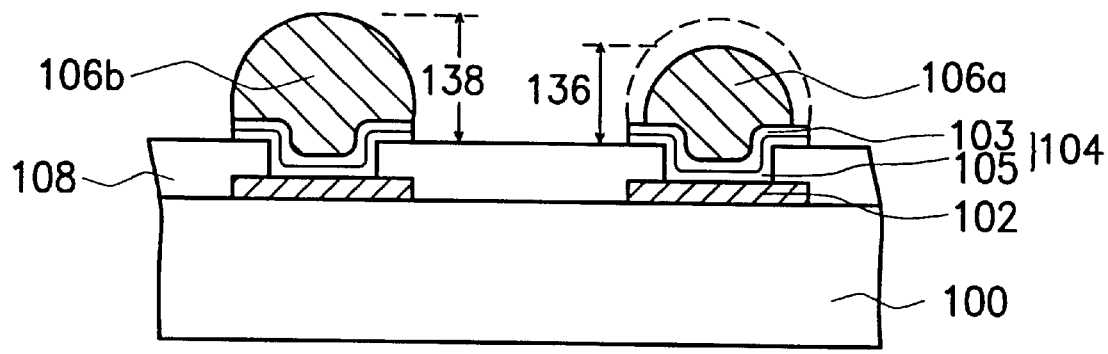

The present invention provides an under bump metal (UBM) structure of solder bumps with improved coplanarity. The UBM structure of the preferred embodiment of the present invention comprises various sizes of areas in order to control the height of solder bumps.

The process of forming the solder bumps begins after bonding pads have been formed on the top surface of the semiconductor wafer. In one known technique, after the bonding pads have been formed, an UBM layer is deposited on top of the semiconductor wafer (including the bonding pads) and covered with a photoresist layer. The UBM layer is placed on top of the semiconductor wafer because the solder material that is used to form the solder bumps does not readily adhere to the bonding pads. The protective layer of photoresist is then patterned and removed in the areas above the bonding pads utilizing known photolithographic processes. Removing portions of the photoresist in the areas above the contact pads exposes the UBM layer that is above the bonding pads. Once the UBM layer is exposed above the bonding pads, solder material is formed over the exposed portions of the UBM layer. One technique for depositing solder material onto a semiconductor wafer involves electroplating the solder material onto the exposed portions of the UBM layer. Once the solder material is plated onto the exposed UBM layer, the protective layer of photoresist and the unwanted portions of the UBM layer are removed. The plated solder material subsequently is put through a reflow process that forms the solder material into smooth solder bumps.

For an electroplating process, for example, if the current distribution is not controlled properly, the volume of the solders will distribute unevenly.

Solders are plated on the substrate first. Next, a photoresist layer is removed. A formation of solder bumps is carried out in a reflow process. However, it is very difficult to control solder distribution evenly due to various factors can affect the formation of the solder bumps. For example, a solder mask that is used on the substrate or the current distribution can affect the formation of the solder bump structure.

The present invention provides an easy method to control the solder distribution by using the UBM structure with different sizes of areas, wherein the various area sizes can control the height of the solder during the reflow process. For a high current density location, the UBM structure is wider to allow the solder distributing in a large surface area; as for a low current density location, the UBM structure is smaller to allow the solder distributing in a smaller surface area. As a result the height of the solder bumps in the high current density area can be reduced and the height of the solder bumps in a low current density can be increased. Due to the distributed area is inversely to the height, therefore even the volume of the solder is difficult to control, the heights of the solder bumps can still be controlled by using the UBM structure to control their distributed areas in order to improve the coplanarity.

The UBM structure of the preferred embodiment of present invention is based on this logic to use different distribution areas to control the heights of the solder bumps.

An experiment is carried out to find out locations that have small volume of solders due to a low current distribution, for example. Those locations will have smaller areas of the UBM structure to allow a small amount of solders. On the contrary, some locations will have bigger UBM areas to allow more solders in high current regions. During the reflow process, the solder will adhere on the UBM surface to form solder bumps. The solders having smaller UBM structure in low current regions will compress together in order to adhere on the smaller surfaces of the UBM structures to form solder bumps. The solders having larger surface areas of the UBM structure in high current regions will distribute and adhere on the surface to form solder bumps that have the same height as the solder bumps on the smaller areas of the UBM structure. For example, a certain amount of solder at a small distributed area will form a higher solder bump than the same amount of solder at a bigger distributed area. Therefore in order to prevent a location that has a large amount of solder due to the high current, a large adhesive area reduces the height of the solder bump. On other hand, when the solder is too little, a small adhesive area is provided to increase the height of the solder bump. Although the volume of the solder is not evenly distributed on the UBM surface, the various sizes of UBM structures that are corresponding to current distribution on the wafer can control the heights of the solder bumps.

The features and advantages of the present invention will be more clearly understood from the following detailed descriptions taking in conjunction with the accompanying drawings.

Figure 2A:
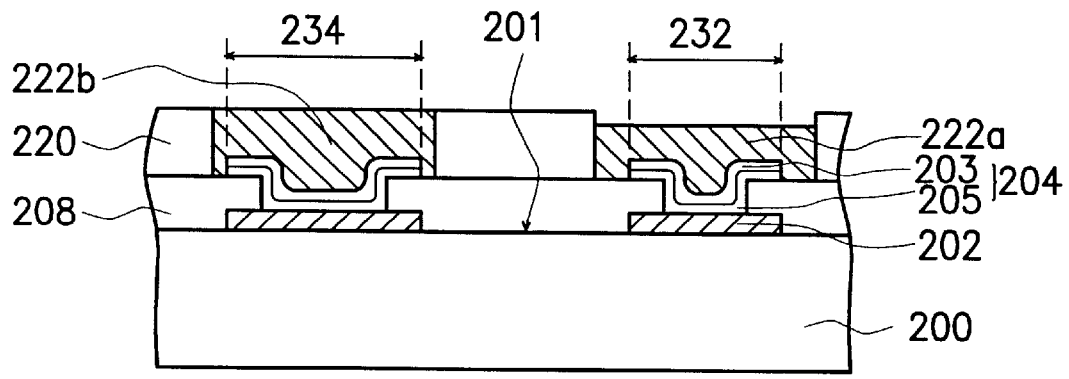
FIGS. 2A and 2B are the cross-sectional views of a UBM structure that can improve coplanarity according to a first preferred embodiment of the present invention.
Figure 2B:
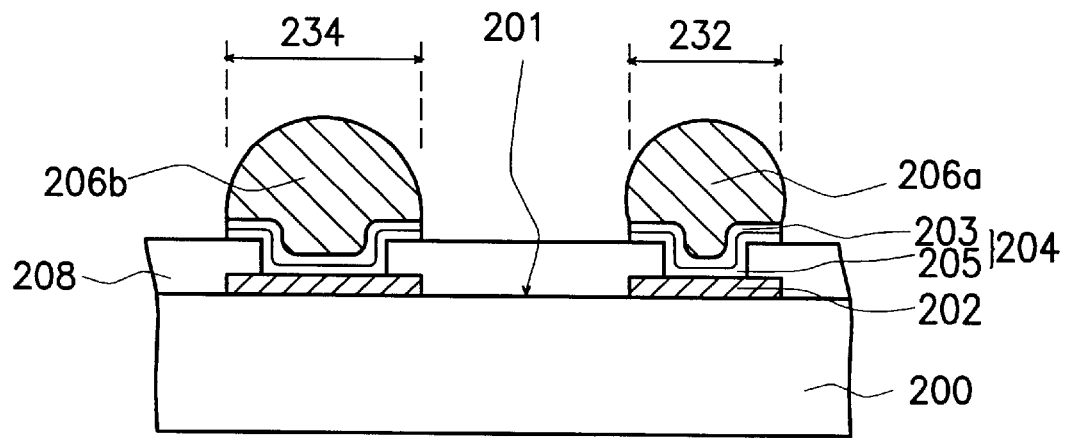

FIG. 2A and FIG. 2B illustrate the cross-sectional views of a UBM structure that can improve coplanarity according to a first preferred embodiment of the present invention.

Referring to FIG. 2A, a substrate 200 comprises at least one active surface 201, wherein a plurality of bonding pads 202 that formed on the active surface 201 are used as connecting nodes to external circuits. The bonding pads 202 are made of aluminum, for example. A passivation layer 208 is formed over the active surface 201, wherein portions of the bonding pads are exposed by the passivation layer 208. The passivation layer 208 can be a polyimide layer but is preferable a silicon oxide layer, silicon nitride layer or layers of other passivation materials known to those having skill in the art. A plurality of UBM layers 204 are formed on the exposed portions of bonding pads 202. The UBM layers 204 have various areas according to the current distribution. The UBM layers 204 are electrically connected to the bonding pads 202. Each UBM layer 204 comprises a barrier layer 203 and a plating layer 205. The barrier layer 203 is made of a material selected from a group comprising of chromium, chromium and copper alloy, titanium, titanium tungsten alloy and a combination thereof. The purpose of the barrier layer 203 is to prevent the ions of the solder bumps from coming into contact with the underlying layers, thereby protecting the underlying passivation layer 208 and the bonding pads 202. The plating layer 205 is formed from materials which provide adequate adhesion between a solder bump and a bonding layer, and that can be selected from a group comprising of nickel, copper, gold, palladium, palladium nickel alloy, silver and a combination thereof. A mask layer 220 is formed on the exposed portions on which the solder is to be electroplated, wherein the solder material comprises tin lead alloy, gold and conductive polymers.

FIG. 2B illustrates a formation of solder bumps after reflowing the solder material over the UBM layer. Solder bumps 232, 234 are formed on the barrier layer 203. Although the volumes of the two solder bumps are different but using different distributed areas of the UBM 204 layer forming solder bumps with the same height. The area of the UBM layer 204 corresponds to the plating current density distributed across the wafer in order to control the solder distribution areas. The uneven distribution of plating current density across the wafer causes the amount of solder being plated non-uniformly, but by utilizing the character of the solder to various the areas of the UBM layer 204 in order to form uniform height of solder bumps. Thus the coplanarity of whole solder bumps structure can be improved to have a more effective bonding process.

Second Embodiment

Figure 3A:
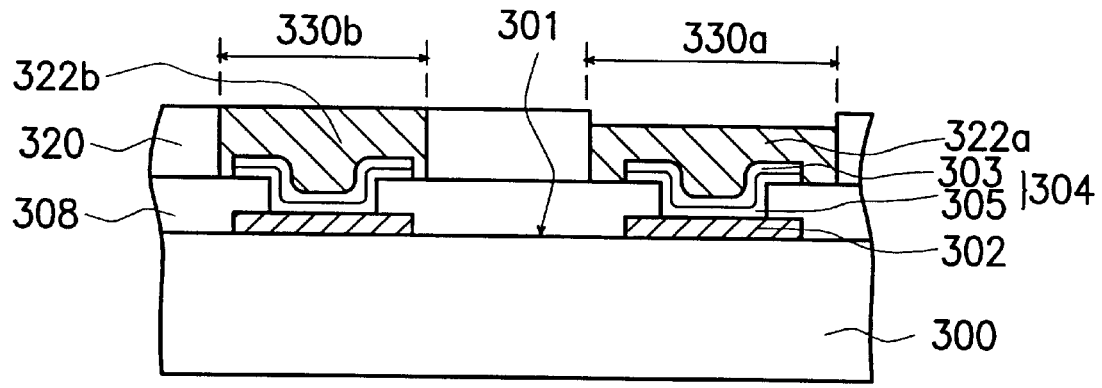
FIGS. 3A and 3B are a method of forming solder bumps on a UBM structure with improved coplanarity in accordance with a second preferred embodiment of the present invention.
Figure 3B:
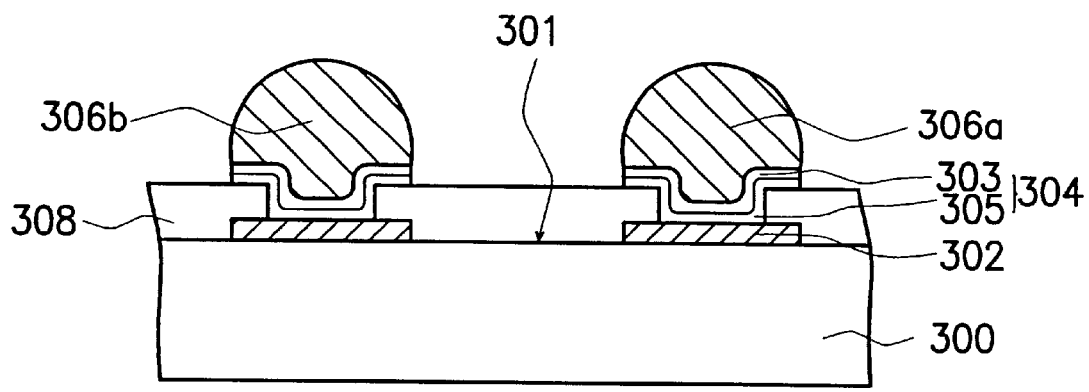

The present invention provides a method of forming solder bumps with improved coplanarity. FIGS. 3A and 3B illustrate a method of forming solder bumps on a UBM structure with improved coplanarity in accordance with a second preferred embodiment of the present invention.

Referring to FIG. 3A, a substrate 300 comprises at least one active surface 301, wherein a plurality of bonding pads 302 that formed on the active surface 301 are serving as connecting nodes to external circuits. The bonding pads 302 are made of aluminum, for example. A passivation layer 308 is formed over the active surface 301, wherein portions of the bonding pads are exposed by the passivation layer 308. The passivation layer 308 can be a polyimide layer but is preferably a silicon oxide layer, silicon nitride layer or layers of other passivation materials known to those having skill in the art. A plurality of UBM layers 304 are formed on the exposed portions of bonding pads 302. The UBM layers 304 have various openings according to the current distribution. The UBM layers 304 are electrically connected to the bonding pads 302. Each UBM layer 304 comprises a barrier layer 203 and a plating layer 305. The barrier layer 303 is made of a material selected from a group comprising of chromium, chromium and copper alloy, titanium, titanium tungsten alloy and a combination thereof. The purpose of the barrier layer 303 is to prevent the ions of the solder bumps from coming into contact with the underlying layers, thereby protecting the underlying passivation layer 308 and the bonding pads 302. The plating layer 305 is formed from materials which provide adequate adhesion between a solder bump and a bonding layer, and that can be selected from a group comprising of nickel, copper, gold, palladium, palladium nickel alloy, silver and a combination thereof. A mask layer 320 is formed on the exposed portions on which the solder is to be electroplated, wherein the solder material comprises tin lead alloy, gold and conductive polymers. The mask layer 320 comprises a plurality of openings 330a, 330b having various sizes. Since the plating current distribution is unevenly across the wafer, utilizing the method of forming various sizes of opening on the UBM layer to control the volume of the solder in order to improve the coplanarity of the solder bumps. The area where the current density is higher, a smaller opening 330b is provided on the UBM layer to allow little solder, but the area where the current density is low, a bigger opening 330a is provided to allow more solder. Therefore using the various sizes of the openings on the UBM layer to control the solder volume in order to form uniform-height of solder bumps (shows on FIG. 3B). To improve the coplanarity of the solder bumps structure either using the various sizes of opening of the UBM layer to control the solder volume or using the various UBM structures to control the height of the solder bumps or using a combination thereof.

The present invention provides a UBM structure with various sizes and a method of forming various opening on a UBM layer both can improve the coplanarity of the solder bumps structure effectively, wherein a combination of the two preferred embodiments can be used to improve the solder bumps coplanarity. The volume and the height of the solder bumps can be controlled and improved tremendously. The yield loss of the production can thus be reduced.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A structure of solder bumps having improved coplanarility comprising:
   a substrate having at least an active surface;
   a plurality of bonding pads formed on the active surface, wherein the bonding pads serve as connecting nodes to external circuits;
   a passivation layer formed over the active surface of the substrate, wherein portions of the bonding pads are exposed by the passivation layer;
   a plurality of Under Ball Metallurgy (UBM) layers formed on the exposed portions of the bonding pads, wherein each UBM layer has a different area and being electrically connected to the bonding pads; and
   a plurality of solder bumps formed on the UBM layers, wherein the solder bumps having various sizes formed substantially with the same height.

2. The structure of claim 1, wherein a material used for the solder bump is selected from a group consisting of tin lead alloy, gold, and conductive polymers.

3. The structure of claim 1, wherein the UBM layers further include a barrier metal layer and a plating layer, the barrier metal layer contacting the bonding pads and the plating layer being formed on the barrier metal layer to connect the solder bumps.

4. The structure of claim 3, wherein a material used for the barrier layer is selected from a group comprising chromium, chromium and copper alloy, titanium, titanium tungsten alloy and a combination thereof.

5. The structure of claim 3, wherein a material used for the plating layer is selected from a group comprising nickel, copper, gold, palladium, palladium and nickel alloy, silver and a combination thereof.

6. A method of forming solder bumps with improved coplanarility comprising:
   providing a substrate having at least an active surface;
   forming a plurality of bonding pads on the active surface of the substrate;
   forming a passviation layer over the active surface of the substrate, wherein portions of the bonding pads are exposed by the passviation layer,
   forming a plurality of Under Ball Metallurgy (UBM) layers on the exposed portions of the bonding pads;
   forming a mask layer having a plurality of openings on the exposed bonding pads,
   wherein the openings have various sizes; and
   forming plurality of solder bumps on the UBM layers, wherein the solder bumps are substantially equivalent in volume and height.

7. The method of claim 6, wherein a material used for the solder bump is selected from a group consisting of tin lead alloy, gold, and conductive polymers.

8. The method of claim 6, wherein the various sizes of openings that are patterned by a photolithography and etching process correspond to current distribution across a wafer in order to control volumes of the solder bumps.

9. The method of claim 6, wherein the UBM layers further include a barrier metal layer and a plating layer, the barrier metal layer contacting the bonding pads and the plating layer being formed on the barrier metal layer to connect the solder bumps.

10. The method of claim 9, wherein a material used for the barrier layer is selected from a group consisting of chromium, chromium copper alloy, titanium, titanium tungsten alloy and combinations thereof.

11. The method of claim 9, wherein a material used for the plating layer is selected from a group consisting of nickel, copper, gold, palladium and combinations thereof.

* * * * *